United States Patent [19]
Madurawe et al.

[11] Patent Number: 5,905,675
[45] Date of Patent: May 18, 1999

[54] BIASING SCHEME FOR REDUCING STRESS AND IMPROVING RELIABILITY IN EEPROM CELLS

[75] Inventors: Raminda U. Madurawe, Sunnyvale; Richard G. Smolen, Redwood City; Minchang Liang, Santa Clara; James D. Sansbury, Portola Valley; John E. Turner, Santa Cruz; John C. Costello; Myron W. Wong, both of San Jose, all of Calif.

[73] Assignee: Altera Corporation, San Jose, Calif.

[21] Appl. No.: 08/995,870

[22] Filed: Dec. 22, 1997

Related U.S. Application Data

[60] Provisional application No. 60/041,026, Mar. 20, 1997.

[51] Int. Cl.$^6$ .................................................. G11C 16/04
[52] U.S. Cl. ................................. 365/185.18; 365/185.05; 365/185.1; 257/319
[58] Field of Search ........................... 365/185.1, 185.18, 365/185.02, 185.05; 257/315, 316, 318, 319, 321, 322

[56] References Cited

U.S. PATENT DOCUMENTS

| | | | |
|---|---|---|---|
| 5,625,211 | 4/1997 | Kowshik | 257/317 |
| 5,742,542 | 4/1998 | Lin et al. | 365/185.08 |
| 5,761,116 | 6/1998 | Li et al. | 365/185.1 |
| 5,764,569 | 6/1998 | Wright | 365/185.09 |

*Primary Examiner*—Son Mai
*Attorney, Agent, or Firm*—Beyer & Weaver LLP

[57] ABSTRACT

Disclosed is a method for biasing dual row line EEPROM cells. The new biasing scheme improves the data retention lifetime of an EEPROM cell by reducing the potential difference between the control gate and the write column of the cell, which reduces the tunnel oxide electric field. In a preferred embodiment, the method involves applying bias voltages to the control gate and write column of an EEPROM cell such that the potential difference between the control gate and the right column is no more than about 0.5 volts. By biasing the cell's write column to a positive voltage, the tunnel oxide field may be significantly reduced. Moreover, the invention provides a method of selecting a write column voltage based on a control gate voltage such that the tunnel oxide field is substantially balanced in all its modes. This biasing scheme minimizes SILC and improves cell reliability.

19 Claims, 4 Drawing Sheets

BIASING SCHEME FOR REDUCING STRESS AND IMPROVING RELIABILITY IN EEPROM CELLS

CROSS-REFERENCE TO RELATED APPLICATIONS

This application claims the benefit of the filing date of provisional application Ser. No. 60/041,026, entitled APPARATUS AND METHOD FOR MARGIN TESTING SINGLE POLYSILICON PROCESS EEPROM CELLS, filed Mar. 20, 1997.

BACKGROUND OF THE INVENTION

The present invention relates to EEPROM cells. More particularly, the invention relates to biasing of dual row line EEPROM cells to reduce stress on the tunnel oxide window and improve the cell's reliability.

FIGS. 1A shows a perspective view of a typical EEPROM cell. The cell 30 is a single polysilicon EEPROM cell. As such, it does not have a polysilicon control gate, but instead has a heavily doped diffusion region in the cell's substrate which is capacitively coupled to its floating gate. The cell 30 is also a single row line EEPROM cell, since word line transistor (NI) and write column transistor (N3) are accessed via a single conductive connection, row line 31.

The cell 30 includes a single polysilicon floating gate structure 32 which performs three functions. At a first end, a tunnel extension 34 of floating gate 32 acts as an electrode in the two terminal device used for tunneling electrons from a heavily doped $N^+$ implant 35 (also referred to as a programming Memory Diffusion or MD) through a tunnel oxide 36 (often about 80Å thick) onto floating gate structure 32. At the other end of this floating gate, a wide area plate 38 is employed as one electrode of a capacitor enabling the floating gate 32 to be raised to a high voltage (e.g., about 6 to 11 volts) by capacitively coupling a programming voltage (e.g., about 9 to 13 volts) from a second electrode 40 (heavily doped N+ silicon, referred to herein as a control gate memory diffusion) through an oxide 42 (often about 180 Å thick). Between these two ends is a section of polysilicon that forms the gate 44 of a read transistor (N2).

The read transistor (N2) is connected in series with a word line transistor (N1) having a gate 46 forming part of a word line (also referred to as a row line) 31. The read and word line transistors separate a sense amp negative (−) input 48 (a source line) from a sense amp positive (+) input 50 (a drain line). Charging the floating gate 32 by tunneling electrons onto it (through tunnel oxide 36) raises the threshold voltage of the read transistor (EEPROM cell 30 is programmed). This shuts off the channel between the sense amp inputs, even when the adjacent word line transistor is turned on. Tunneling electrons off the floating gate 32 reduces the read transistor threshold voltage to negative values, effectively turning this device on (EEPROM cell 30 is erased). The word line transistor in series then controls the signal path between the two sense amp inputs 48 and 50.

The EEPROM cell is programmed or erased by charging or discharging, respectively, the floating gate 32. In order to tunnel electrons onto floating gate 32, a high voltage must be applied to the control gate memory diffusion 40. At the same time, the write column 56 is grounded and the write column transistor (N3) is turned on by, for example, selecting the row line 31 with, for example, 5 volts. The sense amp (−) input 48 can be biased from 5 volts to a high voltage to assist tunneling electrons onto the floating gate 32. The voltage on the control gate memory diffusion 40 is capacitively coupled to the floating gate 32 as is the sense amp (−) input 48 voltage. The resulting positive voltage on floating gate 32 is sufficient to cause tunneling onto floating gate 32 through the tunnel dielectric window 36, thereby programming the EEPROM cell 30.

In order to tunnel electrons off floating gate 32, a high voltage must be applied to memory diffusion 35 while ground is applied to the second heavily doped N+ implant (control gate memory diffusion) 40 which underlies and is capacitively coupled to the wide area plate 38. During this process, ground is also applied to sense amp (−) input 48. The application of high voltage to memory diffusion 35 is accomplished through a write column 56 and a write column select transistor (N3) including (i) a diffusion region 54 conductively connected to write column 56 for data input, (ii) a source/drain diffusion 58 electrically connected to memory diffusion 35, and (iii) a gate electrode 60, which is part of row line 31. When a sufficient potential is applied to the gate 60 of the write column select transistor through row line 31 while a write signal is applied through write column 56, electrons can tunnel off of the floating gate 32 to erase the EEPROM cell.

FIGS. 1B and 1C depict a top view cell layout 100 and a circuit schematic 150 of the EEPROM cell of FIG. 1A, respectively. These depictions focus on cell elements important to the description of the present invention. FIG. 1B clearly shows a single row line 31, word line (N1) and write column (N3) transistors, write column 56 and control gate 38 in relation to the other cell elements previously described with reference to FIG. 1A.

A single row line cell, such as depicted in FIGS. 1A–C, cannot have its write column 56 and its drain line 50 voltages selected separately. As a result, transistors (N1) and (N3) are either both on or both off at any given time depending on whether the row line 31 is selected. During normal operation of the cell, the selection of the row line 31 is under the control of the user. Therefore the manufacturer of a single row line EEPROM cell cannot attribute a fixed setting to the write column terminal 56 and have that bias passed down to the memory diffusion 35 (FIG. 1C) through the transistor (N3). Since voltage on the write column 56 cannot pass through to the programming memory diffusion 35 under the tunnel window 36 when the write column transistor (N3) is off, it is not possible to maintain a steady positive voltage on the memory diffusion 35 during normal operation when word line (drain line) transistor (N1) may be on or off. As a result, the write column is typically grounded (about 0 V) during normal operation of a single row line EEPROM cell in order to maintain the voltage on the memory diffusion (and therefore across the tunnel window when the control gate voltage is fixed) as steady as possible and thereby reduce stress in the cell.

Dual row line EEPROM cells are also known in the art. A top view cell layout and a circuit schematic of a single polysilicon dual row line EEPROM cell is shown in FIG. 2A. The cell 200 has two separate word lines (row lines) 202 and 204 for accessing its drain line and write column, respectively. Otherwise, a typical dual row line EEPROM cell has its remaining elements in common with a single row line EEPROM cell, such as that described above.

In a conventional biasing scheme based on the single row line cell, electrons are tunneled onto the floating gate 32 of a dual row line EEPROM cell by applying a high voltage to the control gate memory diffusion 40. At the same time, the write column 56 is grounded and the write column select line 202 is selected with, for example, 5 volts. The sense amp (−)

input 48 can be biased to a positive voltage to assist tunneling electrons onto the floating gate 32. The voltages on the control gate memory diffusion 40 and the sense amp (−) input 48 are capacitively coupled to the floating gate 32. The resulting positive voltage on floating gate 32 is sufficient to cause tunneling onto floating gate 32 through the tunnel dielectric window 36, thereby programming the EEPROM cell 200.

In order to tunnel electrons off floating gate 32 of a dual row EEPROM cell, a high voltage must be applied to memory diffusion 35 while ground is applied to the control gate memory diffusion 40. During this process, ground may also be also applied to sense amp (−) input 48. The application of high voltage to memory diffusion 35 is accomplished through the write column 56 and a write column select transistor (N3) including (i) a diffusion region 54 conductively connected to write column 56 for data input, (ii) a source/drain diffusion 58 electrically connected to memory diffusion 35, and (iii) a gate electrode 60, which is part of a second row line 204. When a sufficient potential is applied to the gate 60 of the write column select transistor through the write column select line (second row line) 204, while a write signal is applied through write column 56, electrons can tunnel off of the floating gate 32 to erase the EEPROM cell.

It should be noted that EEPROM cells may also be formed by a double polysilicon process. Such a "double poly" EEPROM cell has a polysilicon control gate capacitively coupled to its floating gate. As will be readily understood by those of skill in the art from the description below, the present invention is also applicable to double poly EEPROM cells.

A further description of a typical EEPROM cell and its functional elements is available the publication "EPM7032 Process, Assembly, and Reliability Information Package" available from Altera Corporation of San Jose Calif. That document is incorporated herein by reference for all purposes.

In order for an MOS transistor to conduct, the voltage on its gate must overcome (be greater than) the transistor's threshold voltage ($V_{th}$). Generally, the threshold voltage is that gate voltage required to create an inversion layer in the transistor's channel so that it conducts. When the MOS transistor is part of a programmable bit of memory, such as an EEPROM cell, there are two gates: The floating gate and the control gate. Such a cell will have two threshold voltages, corresponding to each of its programmed and erased states. The floating gate voltage required to invert the transistor ($V_{th}$) does not change for a given cell, but the control gate voltage to invert the transistor (that is, to bring the floating gate to $V_{th}$) differs depending upon the charged or discharged state of the cell.

Prior to shipping an EEPROM memory cell product, a manufacturer will generally test the cells to guarantee that a each bit of memory has a good margin, and that the bit will maintain its programmed or erased state over the lifetime of the cell. The "margin" is the voltage required on a cell's control gate to cause a change in the state of a bit of memory. Since a programmable cell has two threshold voltages, it will have two margin voltages: One for the programmed state and one for the erased state. In an EEPROM cell, an erased bit will have a lower margin voltage, typically between about −5V to 0V, and a programmed bit will typically have a higher margin voltage, typically between about 3 V and 8 V. In normal cell operation, an EEPROM's control gate will conventionally be set at a value between the programmed and erased ranges, for example about 1.7 V.

Conventionally, the same biasing scheme has been used in both single and dual row line EEPROM cells. As a result, in both cases, the potential difference between the control gate and the write column is about the same as the voltage on the control gate, e.g., 1.7 V.

One potential problem with EEPROM cells is that the charge on a programmed floating gate is subject to charge retention problems arising from stress-induced leakage current (SILC) through the tunnel dielectric. A contributor to SILC in such a conventionally biased cell is charge trapping in the tunnel oxide during the cell's program and erase cycles. When a cell is programmed and erased, electrons move to and from the floating gate through the tunnel dielectric. These electrons can create "traps" in the oxide (i.e., electrons are trapped in the oxide). The trap density increases with the number of program and erase cycles seen by the tunnel dielectric. Due to the presence of these traps, a programmed or erased floating gate may show an enhanced charge loss or charge gain under low electric fields across the tunnel dielectric commonly seen during normal operating conditions of the cell. Such low level charge loss and charge gain mechanisms are undesirable since EEPROM devices need to have about a ten-year lifetime to be practical in most user environments. As chip designers allow In System Programming (ISP) capabilities to the user, the number of program and erase cycles used will increase, adding more pressure on immunity from charge retention problems due to SILC leakages.

Since the user can store a device unpowered on the shelf, or use the device on a system board fully powered, a chip supplier needs to guarantee both programmed and erased bit charge retention under both modes of operation. The electric fields across the tunnel dielectrics differ between the two modes for both programmed and erased bits. As a result, the worst case condition acts as the dominating field to ensure immunity to SILC leakages. A technique to balance and reduce these fields would be beneficial to guarantee margins for SILC.

Changes in EEPROM cell design may affect the amount of stress on the tunnel window and increase the likelihood of SILC problems. For example, patent application Ser. No. 08/995,873 (Attorney Docket No. ALTRP022), which is incorporated herein by reference for all purposes, discloses process and circuit changes to EEPROM cells which increase a cell's threshold voltage, and in turn increase the cell's margin voltage. Increasing the margin voltage increases the potential that will be applied across the cell's tunnel window during margin testing, which renders the possibility of an SILC more likely.

Accordingly, a way of biasing dual row line EEPROM cells which would reduce the stress on a cell's tunnel dielectric window would be desirable.

SUMMARY OF THE INVENTION

The present invention accomplishes this result by the recognition and exploitation of the fact that a dual row line EEPROM cell allows independent control of its word line and write column transistors. In a preferred embodiment, a cell's tunnel oxide field may be significantly reduced by biasing the cell's write column to a positive voltage. Moreover, the invention provides a method of selecting a write column voltage based on a control gate voltage such that the tunnel oxide field is substantially balanced in all its modes. This biasing scheme minimizes SILC and improves cell reliability.

The invention also allows the floating gate transistor to be biased to higher gate voltages. High gate voltages allow more on current from the erased cell, increasing both the stability and the speed of the device.

These and other features and advantages of the invention will be described in more detail below.

DETAILED DESCRIPTION OF THE PREFERRED EMBODIMENTS

The present invention will be described with reference to preferred embodiments. It will be understood by those skilled in the art that variations to the described method and apparatus may be made without departing from the scope of the present invention.

The present invention provides an improved method for biasing dual row line EEPROM cells. The new biasing scheme improves the data retention lifetime of an EEPROM cell by reducing the potential difference between the control gate and the write column of the cell, which reduces the tunnel oxide electric field. More specifically, the biasing scheme reduces the potential between the memory diffusion under the tunnel window and the floating gate above the tunnel window. In a preferred embodiment, the biasing scheme of the present invention also minimizes fluctuations in the tunnel oxide dielectric field in all modes of operation of the cell. These are: (1) Unbiased (when the cell is not connected to a power source); (2) biased (when the cell is on a system board and powered up) with the word line controlling transistor (N1) selected; (3) biased, with the word line controlling transistor (N1) unselected. The relatively constant field across the tunnel window also reduces the worst case electric field for SILC leakage immunity.

Figure 1A:
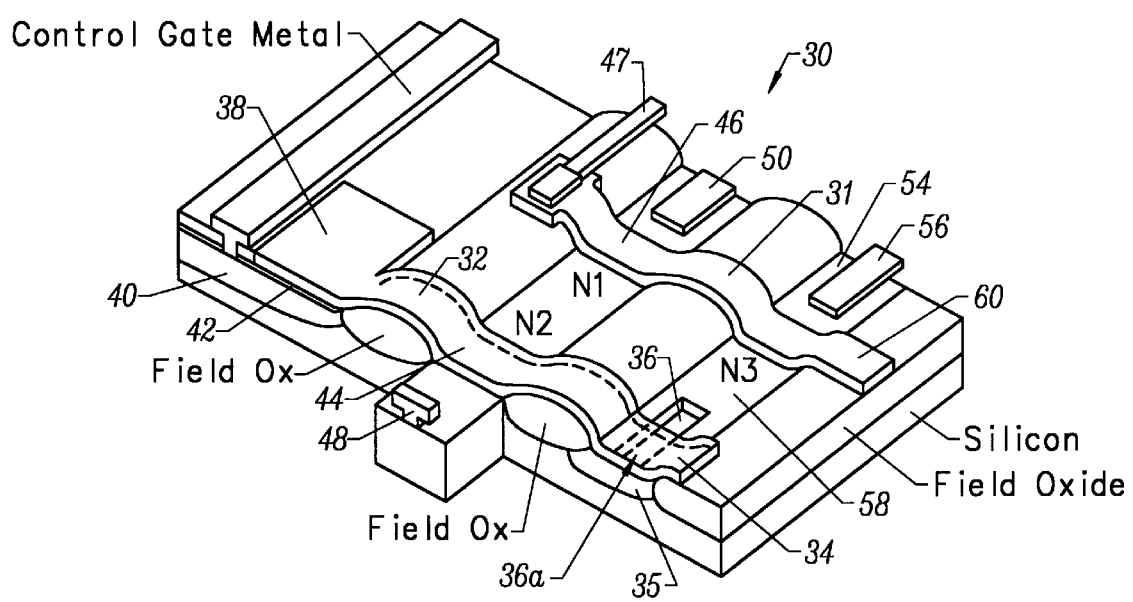
FIG. 1A is a cross-sectional perspective view of a single row line single polysilicon EEPROM cell.
Figure 1B:
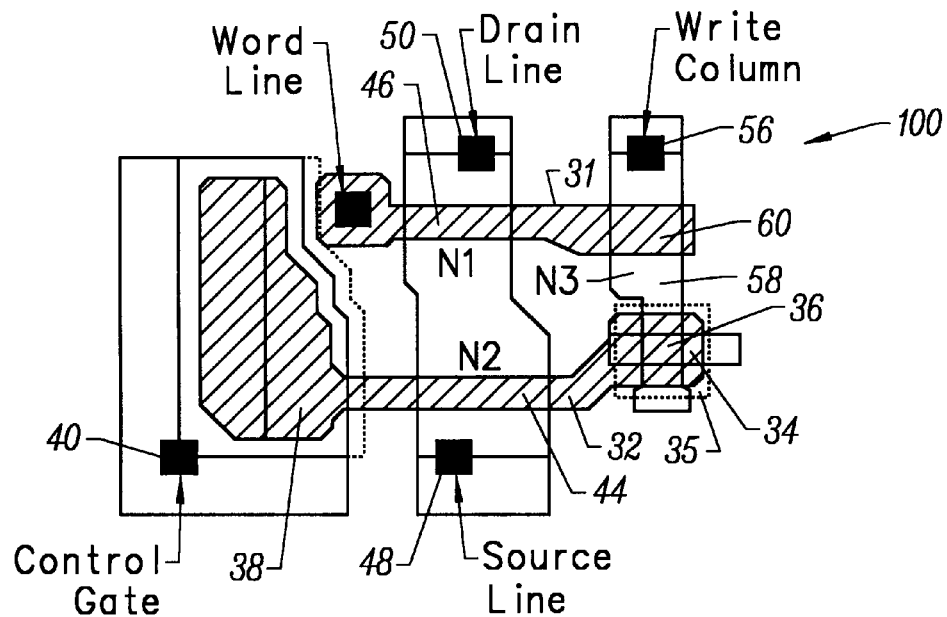
FIG. 1B is a top view of a single row line single polysilicon EEPROM cell layout.
Figure 1C:
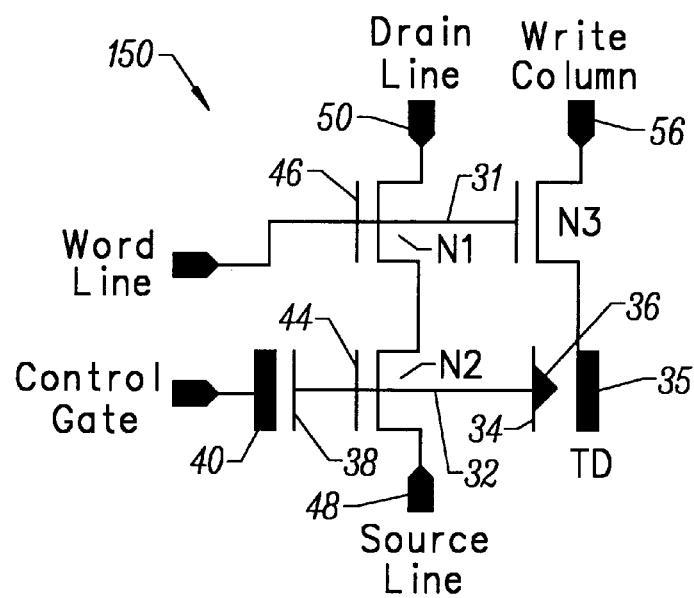
FIG. 1C is a schematic circuit diagram of the single row line EEPROM cell of FIGS. 1A and 1B.
Figure 2A:
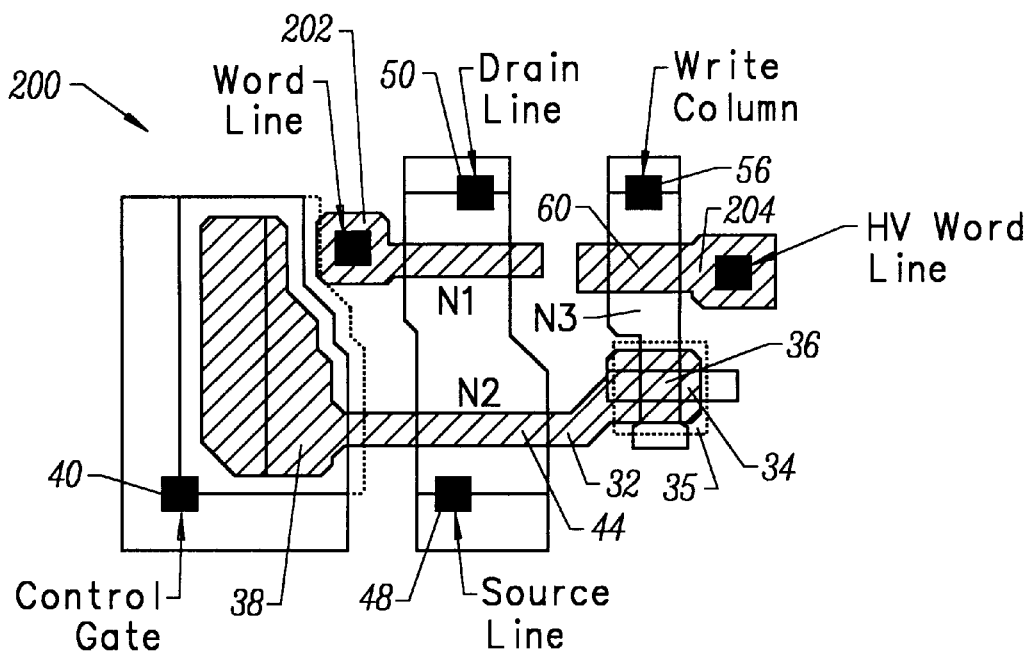
FIG. 2A is a top view of a dual row line single polysilicon EEPROM cell layout.
Figure 2B:
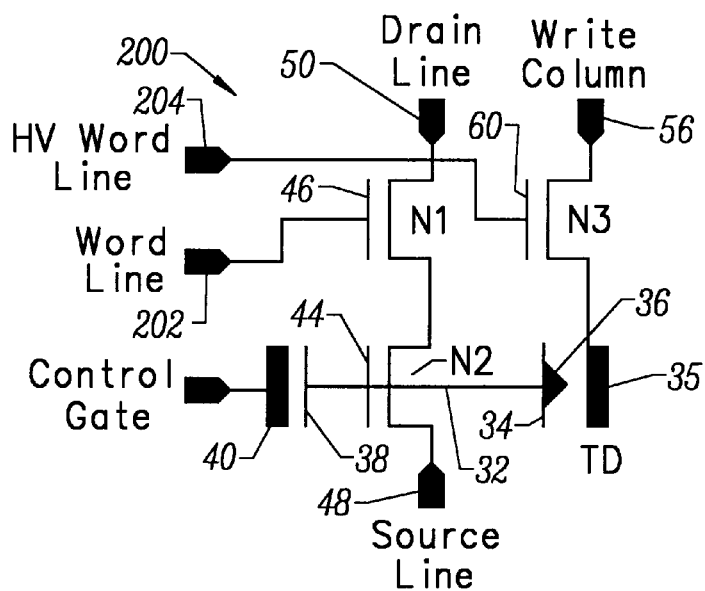
FIG. 2B is a schematic circuit diagram of the dual row line EEPROM cell of FIG. 2A.

The biasing scheme of the present invention will be described with reference to FIGS. 2A and 2B. In a preferred embodiment, the control gate 40 of EEPROM cell 200 is biased to between about 0 and 3.0 V, more preferably between about 1.3 and 2.3 V, and most preferably about 1.82 V. The write column 56 is biased to between about 0.0 to about 3.0 V, more preferably between about 1.0 and 2.0 V, and most preferably about 1.54 V. The remaining biases are not changed from their conventional settings. For example, the write column select line (second row line) 204 is biased to about 3.5 V; the word line (row line) 202 is biased to about 3.5 V if selected, and grounded if unselected; the source line 48 is biased to between about 0.07 to 0.49 V if erased, and 0.07 V if programmed; the drain line 50 is biased to between about 1.25 and 1.08 V if erased, and about 1.25 V if programmed.

The biasing scheme of the present invention recognizes and exploits the fact that a dual row line EEPROM cell allows independent control of its word line (N1) and write column (N3) transistors. Because the write column transistor (N3), which governs the voltage provided to the cell's programming memory diffusion, is independent of the user-controlled word line transistor (N1), the memory diffusion may be biased by a write column voltage after the cell is programmed, and that voltage may be maintained throughout the life of the cell. This biasing will not be affected by changes in the status of the word line (N1) transistor. By biasing the cell's write column to a positive voltage, the tunnel oxide field may be significantly reduced.

Moreover, the invention provides a method of selecting a write column voltage based on a control gate voltage such that the tunnel oxide field is substantially balanced in all its modes. This biasing scheme minimizes SILC and improves cell reliability. The bias voltage on the control gate 40 and the write column 56 may be related by the following equation: $V_{wc} \cong (k_{cg}*V_{cg})/(1-k_{wc})$, where $V_{wc}$ is the write column bias; $k_{cg}$ is the control gate to floating gate coupling ratio, which is preferably about 0.55 to 0.9, more preferably about 0.7 to about 0.8 and most preferably about 0.74; $V_{cg}$ is the control gate bias; and $k_{wc}$ is the control gate to write column coupling ratio, which is preferably about 0.05 to 0.3, more preferably about 0.09 to about 0.15 and most preferably about 0.12. It should be noted that the benefits of the present invention may be achieved over a range of bias voltages, such as $V_{wc} \cong 0.5(k_{cg}*V_{cg})/(1-k_{wc})$ to $1.5(k_{cg}*V_{cg})/(1-k_{wc})$. As $V_{cg}$ is raised, for example in a cell modified to provide a measurable erase margin, $V_{wc}$ is raised according to this relation in order to optimize data retention fields across the tunnel window 36. Therefore, once the control gate voltage for a cell is determined (normally in accordance with the sense amp operation), the write column bias may be determined by this equation to ensure that the tunnel oxide field is optimally balanced.

A cell biased in accordance with a preferred embodiment of the present invention will have a substantially balanced tunnel oxide electric filed for all modes of the cell. A programmed cell biased in accordance with the most preferred embodiment of the invention, described above, will have about the following tunnel oxide electric field values: Unbiased: 1.88 MV/cm; biased/selected: 1.88 MV/cm; and biased/unselected: 1.84 MV/cm. The erased cell will have about the following tunnel oxide electric field values: Unbiased: −3.51 MV/cm; biased/selected: −3.51 MV/cm; and biased/unselected: −3.51 MV/cm. These electric fields occur at the beginning of a program or erase state.

Another important electric field balancing is the minimum electric field required to guarantee a ten-year lifetime for the erased and programmed cell. For a programmed cell biased in accordance with the most preferred embodiment of the invention, described above, these field values are: Unbiased: 1.1 MV/cm; Biased/selected: 1.1 MV/cm; and biased/unselected: 1.1 MV/cm. The erased cell will have about the following electric field values: Unbiased: −1.1 MV/cm; biased/selected: −1.1 MV/cm; and biased/unselected: −1.1 MV/cm. At these low fields, SILC is virtually eliminated and a good margin is provided for charge retention problems.

Use of the biasing method of the present invention reduces stress and thereby improves data retention in EEPROM cells in the cell's modes. The invention is also particularly useful for reducing stress in cells which have been modified to have higher threshold voltages for margin testing purposes.

Figure 3:
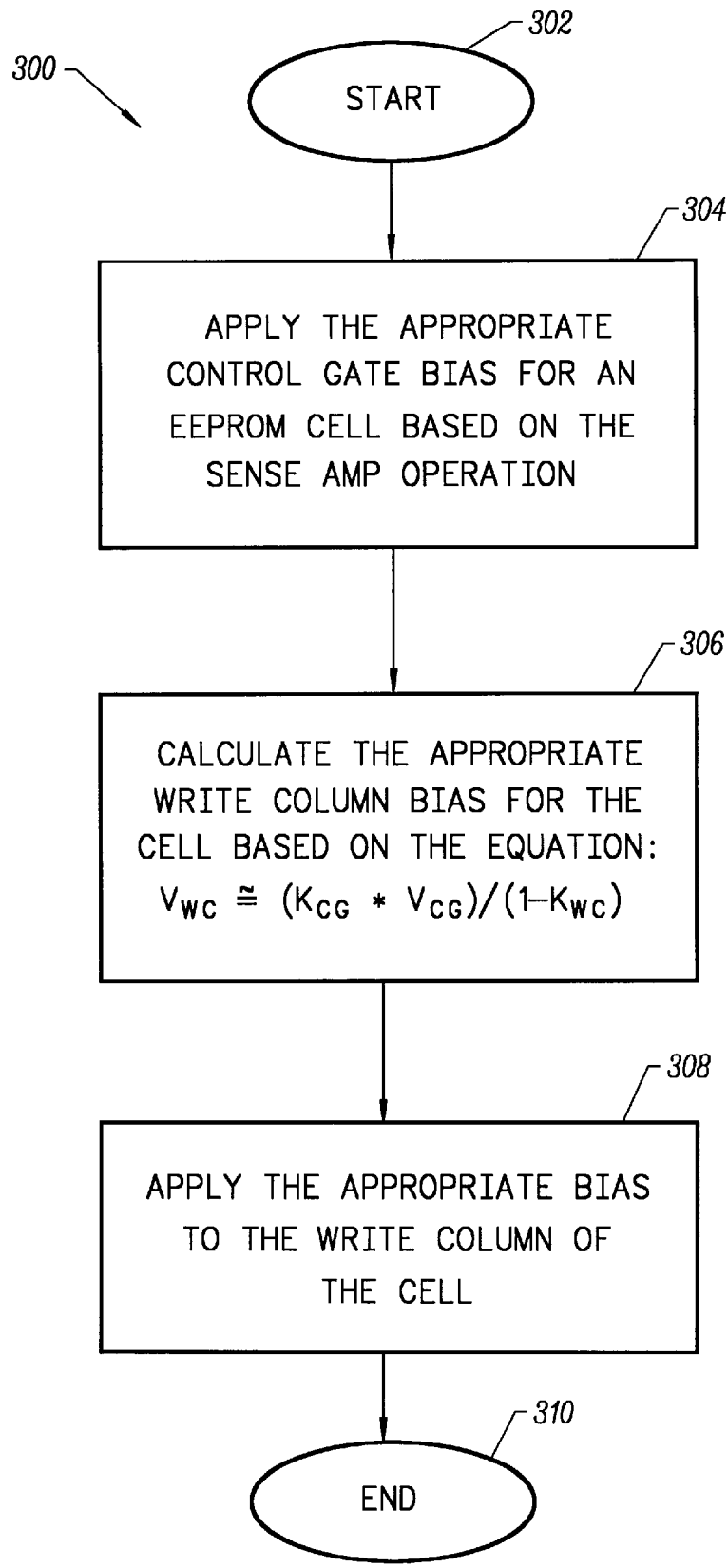
FIG. 3 is a flow chart diagram of a process of biasing a dual row line EEPROM cell according to the present invention.

FIG. 3 shows a flow chart diagram of a process of biasing a dual row line EEPROM cell according to the present invention. The process flow 300 begins at 302, and at a step 304 an EEPROM's control gate is biased based on the operating condition of the cell's sense amp. Then, at a step 306, the appropriate bias voltage for the cell's write column to balance the tunnel oxide field for all modes of the cell is determined by the equation: $V_{wc} \cong (k_{cg}*V_{cg})/(1-k_{wc})$, where $V_{wc}$ is the write column bias; $k_{cg}$ is the control gate to floating gate coupling ratio; and $k_{wc}$ is the control gate to write column coupling ratio. Next, at a step 308, the voltage calculated in the previous step 306 is applied to the write column. The process ends at 310.

EXAMPLE

An EEPROM's control gate is biased to about 1.82 V in accordance with the cell's sense amp operation. The control gate to floating gate coupling ratio for the cell is about 0.74. The control gate to write column coupling ratio for the cell is about 0.12. The write column bias which will best balance the cell in all its modes is determined by the relation: $V_{wc}=(k_{cg}*V_{cg})/(1-k_{wc})$, where $V_{wc}$ is the write column bias; $k_{cg}$ is the control gate to floating gate coupling ratio; and $k_{wc}$ is the control gate to write column coupling ratio. Using this equation, the write column bias is calculated to be about 1.54 V.

It should be noted that the preceding description relates to an NMOS transistor, i.e., it has an n-type source, an n-type drain, and a p-type channel. Although not shown, the EEPROM transistor could also be a PMOS transistor having a p-type source, a p-type drain, and an n-type channel. In that case, the dopant concentrations specified herein for NMOSs would apply with equal validity to the PMOS—only the dopant conductivity types would be reversed.

Although a specific embodiment of the present invention has been described in detail, it should be understood that the present invention may be embodied in many other specific forms without departing from the spirit or scope of the invention as recited in the claims.

What is claimed is:

1. A method of biasing a dual row line EEPROM cell, comprising:
   providing a dual row line EEPROM cell having a control gate and a write column, said write column electrically linked to a memory diffusion via a transistor having a dedicated row line, said memory diffusion separated from a floating gate by a tunnel oxide; said floating gate capacitively coupled to said control gate;
   applying a first bias voltage to said control gate;
   applying a second positive bias voltage to said write column; and
   applying a voltage higher than said second bias voltage to said dedicated row line to pass said second bias voltage through said transistor to said memory diffusion.
   wherein the potential difference between said control gate and said write column is no more than about 0.6 volts.

2. The method of claim 1, wherein the voltage applied to said control gate is between about 1.0 to 2.5 volts, the voltage applied to said write column is between about 1.0 and 2.5 volts, and said dedicated row line voltage is about 3.5 V.

3. The method of claim 2, wherein the voltage applied to said control gate is about 1.82 volts and the voltage applied to said write column is about 1.54 volts.

4. The method of claim 1, whereby the bias applied to said write column is determined by the equation: $V_{wc} \cong (k_{cg}*V_{cg})/(1-k_{wc})$, where $V_{wc}$ is the write column bias; $k_{cg}$ is the control gate to floating gate coupling ratio; and $k_{wc}$ is the control gate to write column coupling ratio.

5. The method of claim 1, wherein said biases are applied during normal operation of the cell.

6. The method of claim 1, wherein said biases are applied during margin testing of the cell.

7. A method of biasing a dual row line EEPROM cell having a control gate and a write column, said write column electrically linked to a memory diffusion, said memory diffusion separated from a floating gate by a tunnel oxide, said floating gate capacitively coupled to said control gate, comprising:
   applying a first bias voltage to said control gate;
   applying a second non-zero bias voltage to said write column; and
   wherein the potential difference between said control gate and said write column is no more than about 0.6 volts.

8. A method of balancing the tunnel oxide electric field of a EEPROM cell, comprising:
   providing a dual row line EEPROM cell having a control gate and a write column, said write column electrically linked to a memory diffusion via a transistor having a dedicated row line, said memory diffusion separated from a floating gate by a tunnel oxide; said floating gate capacitively coupled to said control gate;
   applying a first bias voltage to said control gate;
   determining a second bias to be applied to said write column using the equation: $V_{wc}=(k_{cg}*V_{cg})/(1-k_{wc})$, where $V_{wc}$ is the write column bias; $k_{cg}$ is the control gate to floating gate coupling ratio; and $k_{wc}$ is the control gate to write column coupling ratio;
   applying said second bias voltage to said write column; and
   applying a voltage higher than said second bias voltage to said dedicated row line to pass said second bias voltage through said transistor to said memory diffusion.

9. The method of claim 8, wherein the potential difference between said control gate and said write column is no more than about 0.6 volts.

10. The method of claim 8, wherein said first bias voltage is about 1.82 V, said second bias voltage is about 1.54 V, and said dedicated row line voltage is about 3.5 V.

11. A dual row line EEPROM cell, comprising:
    a semiconductor substrate having a memory diffusion;
    a tunnel dielectric window formed on said memory diffusion;
    a floating gate formed on said tunnel dielectric window;
    a control gate having a first bias voltage;
    a write column having a second non-zero bias voltage;
    a dedicated row line having a third bias voltage higher than said second bias voltage;
    wherein said write column is electrically linked to said memory diffusion via a transistor controlled by said dedicated row line, said memory diffusion is separated from said floating gate by said tunnel oxide, and said floating gate is capacitively coupled to said control gate; and
    wherein the potential difference between said control gate and said write column is no more than about 0.6 volts.

12. The cell of claim 1, wherein said control gate bias voltage is between about 1.0 to 2.5 volts, the voltage applied to said write column is between about 1.0 and 2.5 volts, and said dedicated row line voltage is about 3.5 V.

13. The cell of claim 12, wherein the voltage applied to said control gate is about 1.82 volts and the voltage applied to said write column is about 1.54 volts.

14. The cell of claim 11, whereby the bias on to said write column is determined by the equation: $V_{wc} \cong (k_{cg}*V_{cg})/(1-k_{wc})$, where $V_{wc}$ is the write column bias; $k_{cg}$ is the control gate to floating gate coupling ratio; and $k_{wc}$ is the control gate to write column coupling ratio.

15. The cell of claim 11, wherein said cell is under margin testing.

16. The cell of claim 11 wherein the cell is biased such that the electric field across the tunnel dielectric window is about the same in all modes of operation when the cell is programmed or erased.

17. The cell of claim 16, wherein the cell is programmed and the electric field across the tunnel dielectric window is about 1.1 MV/cm.

18. The cell of claim 16, wherein the cell is erased and the electric field across the tunnel dielectric window is about −1.1 MV/cm.

19. A dual row line EEPROM cell, comprising:

a control gate having a first bias voltage;

a write column having a second bias voltage;

wherein said write column is electrically linked to a memory diffusion via a transistor having a dedicated row line, said memory diffusion is separated from a floating gate by a tunnel oxide, and said floating gate capacitively coupled to said control gate; and wherein the potential difference between said control gate and said write column is no more than about 0.6 volts.

* * * * *